United States Patent
Zhu et al.

(10) Patent No.: US 11,817,461 B2
(45) Date of Patent: Nov. 14, 2023

(54) LIGHT-EMITTING PANEL, METHOD MANUFACTURING THE SAME, AND DISPLAY DEVICE HAVING THE SAME WITH CONNECTION PORTION

(71) Applicant: TCL CHINA STAR OPTOELECTRONICS TECHNOLOGY CO., LTD., Shenzhen (CN)

(72) Inventors: Maoxia Zhu, Shenzhen (CN); Hongyuan Xu, Shenzhen (CN); Xu Wang, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 196 days.

(21) Appl. No.: 17/251,798

(22) PCT Filed: Nov. 11, 2020

(86) PCT No.: PCT/CN2020/127987
§ 371 (c)(1),
(2) Date: Dec. 12, 2020

(87) PCT Pub. No.: WO2022/048011
PCT Pub. Date: Mar. 10, 2022

(65) Prior Publication Data
US 2022/0320143 A1    Oct. 6, 2022

(30) Foreign Application Priority Data
Sep. 3, 2020 (CN) .......................... 202010917665.4

(51) Int. Cl.
H01L 27/12 (2006.01)
H01L 25/16 (2023.01)
H01L 23/00 (2006.01)

(52) U.S. Cl.
CPC ............ H01L 27/124 (2013.01); H01L 24/03 (2013.01); H01L 24/05 (2013.01); H01L 25/167 (2013.01);
(Continued)

(58) Field of Classification Search
CPC ........................... H01L 27/124; H01L 25/167
See application file for complete search history.

(56) References Cited

U.S. PATENT DOCUMENTS 6,333,603 B1    12/2001 Juang
2015/0028343 A1*  1/2015 Li ..................... H01L 21/76805
                                                        438/158

(Continued)

FOREIGN PATENT DOCUMENTS

CN    202425199 U    9/2012
CN    103365014 A    10/2013
(Continued)

OTHER PUBLICATIONS

International Search Report in International application No. PCT/CN2020/127987, dated May 26, 2021.
(Continued)

*Primary Examiner* — Lex H Malsawma
*Assistant Examiner* — Daniel Hyun Suh
(74) *Attorney, Agent, or Firm* — PV IP PC; Wei Te Chung; Zhigang Ma

(57) ABSTRACT

A light-emitting panel, a method making same, and a display panel are disclosed in the present disclosure. The light-emitting panel includes a light-emitting board which includes a substrate; a first metal layer disposed on the
(Continued)

substrate; a gate insulating layer covering the first metal layer; and a second metal layer on a side of the gate insulating layer away from the first metal layer. The second metal layer includes a connection portion located in the bonding area of the light-emitting board, and a conductive protection layer formed by chemical plating is disposed on a surface of the connection portion.

12 Claims, 5 Drawing Sheets

(52) U.S. Cl.
 CPC ...... *H01L 27/1262* (2013.01); *H01L 27/1288* (2013.01); *H01L 2224/03622* (2013.01); *H01L 2224/03825* (2013.01); *H01L 2224/05022* (2013.01); *H01L 2224/05073* (2013.01); *H01L 2224/05147* (2013.01); *H01L 2224/05562* (2013.01); *H01L 2224/05573* (2013.01); *H01L 2224/05611* (2013.01)

(56) References Cited

U.S. PATENT DOCUMENTS

| | | | |
|---|---|---|---|
| 2017/0018651 A1* | 1/2017 | Lv | H01L 29/7869 |
| 2017/0062478 A1 | 3/2017 | Choi | |
| 2018/0047714 A1* | 2/2018 | Feng | H01L 23/3675 |
| 2020/0235127 A1* | 7/2020 | Li | H01L 27/124 |
| 2021/0175465 A1* | 6/2021 | Zhou | H01L 27/124 |

FOREIGN PATENT DOCUMENTS

| | | | | |
|---|---|---|---|---|
| CN | 104049393 A | 9/2014 | | |
| CN | 106896960 A | 6/2017 | | |
| CN | 109949703 A | 6/2019 | | |
| CN | 110416427 A | 11/2019 | | |
| CN | 110580855 A | 12/2019 | | |
| CN | 110850651 A | 2/2020 | | |
| KR | 20150120801 A | 10/2015 | | |
| WO | 2019095214 A1 | 5/2019 | | |
| WO | 2020073558 A1 | 4/2020 | | |
| WO | WO-2020073558 A1 * | 4/2020 | ....... | G02F 1/136204 |

OTHER PUBLICATIONS

Written Opinion of the International Search Authority in International application No. PCT/CN2020/127987, dated May 26, 2021.
Chinese Office Action issued in corresponding Chinese Patent Application No. 202010917665.4 dated Aug. 4, 2023, pp. 1-9.

* cited by examiner

The present application relates to the field of display technologies, and in particular to a light-emitting panel, a method manufacturing the same, and a display device having the same.

BACKGROUND OF INVENTION

Currently, due to the limitation of backlight in traditional liquid crystal display (LCD) panels, such as high power consumption and low contrast, the backlight of LCD panels is forced to be developed toward local control. Therefore, mini-light emitting diode (LED) and micro-LED display technologies appear in the industry. Mini-LED and micro-LED display technologies are based on the traditional LCD display technologies, using multiple mini or micro-volume light-emitting chips as light-emitting panels of the LCD panels, thereby achieving local control, so as to improve the display contrast.

In the mini-LED and micro-LED panels, a light-emitting panel generally includes a substrate, a first metal layer disposed on the substrate, an insulating layer covering the first metal layer, a second metal layer disposed on the insulating layer, and a passivation layer covering the second metal layer. The light-emitting panel has a light-emitting area and a bonding area located beside the light-emitting area. A part of the second metal layer located in the bonding area exposes a second passivation layer to air, for bonding chips on films (COF) and other driving chips.

However, the part of the second metal layer located in the bonding area is easily oxidized in the air. After the second metal layer is oxidized, the impedance thereof is greatly increased, decreasing reliability.

SUMMARY OF INVENTION

Technical Problems:

In the existing mini-LED and micro-LED panels, a part of the second metal layer located in the bonding area is easily oxidized in the air. After the second metal layer is oxidized, the impedance thereof is greatly increased, decreasing reliability Technical Solutions In a first aspect, the present disclosure provides a light-emitting panel, comprising: a light-emitting board, the light-emitting board including a light-emitting area and a bonding area located beside the light-emitting area, wherein the light-emitting board includes: a substrate; a first metal layer disposed on the substrate; a gate insulating layer covering the first metal layer; a second metal layer disposed on a side of the gate insulating layer away from the first metal layer; and a light-emitting chip disposed on a side of the second metal layer away from the gate insulating layer; wherein the second metal layer includes a connection portion located in the bonding area, and a conductive protection layer formed by chemical plating is disposed on a surface of the connection portion.

In some embodiments, the conductive protection layer includes a tin metal layer.

In some embodiments, the light-emitting board further includes an active layer disposed on a side of the gate insulating layer away from the first metal layer, and the active layer includes an active island, wherein the active island includes a semiconductor layer, the semiconductor layer includes a channel region and a doped region located beside the channel region, an ion doped layer is disposed on the doped region, and the second metal layer further includes source and drain electrodes disposed on the ion doped layer.

In some embodiments, the light-emitting board further includes a passivation layer disposed on a side of the gate insulating layer away from the first metal layer; and the connection portion includes a first portion and a second portion located on a side of the first portion, the passivation layer covers the first portion, and the conductive protection layer is disposed on a surface of the second portion.

In some embodiments, the conductive protection layer covers an upper surface and a side surface of the second portion.

In some embodiments, materials of the first metal layer and the second metal layer are both copper.

In a second aspect, the present disclosure further provides a method of manufacturing the light-emitting panel, comprising:

a step S10 of forming a first metal layer on a substrate;

a step S20 of forming a gate insulating layer covering the first metal layer;

a step S30 of forming a second metal layer on a side of the gate insulating layer away from the first metal layer;

a step S40 of performing a patterning process on the second metal layer to form a connection portion located in a bonding area;

a step S50 of placing the connection portion in a coating solution, and forming a conductive protection layer on a surface of the connection portion by chemical plating; and a step S60 of mounting a light-emitting chip on the second metal layer.

In some embodiments, the conductive protection layer includes a tin metal layer.

In some embodiments, the coating solution includes positive divalent tin ions and thiol-based urea.

In some embodiments, after the step S20 and before the step S30, the method of manufacturing the light-emitting panel further comprises:

a step S71 of forming an active layer on the gate insulating layer; and a step S72 of patterning the active layer to form an active island, while forming a connection hole penetrating the gate insulating layer and extending to a surface of the first metal layer;

wherein the second metal layer further includes source and drain electrodes disposed on the active island, and the connection hole is filled with the connection portion.

In some embodiments, after the step S40 and before the step S50, the method of manufacturing the light-emitting panel further comprises:

a step S81 of forming a passivation layer covering the second metal layer; and a step S82 of performing a patterning process on the passivation layer to expose a second portion of the connection portion.

In a third aspect, the present disclosure further provides a display panel, comprising: a driving chip and a light-emitting panel, the light-emitting panel including a light-emitting board, the light-emitting board including a light-emitting area and a bonding area located beside the light-emitting area, and the light-emitting board including: a substrate; a first metal layer disposed on the substrate; a gate insulating layer covering the first metal layer; a second metal layer disposed on a side of the gate insulating layer away from the first metal layer; and a light-emitting chip disposed on a side of the second metal layer away from the gate insulating layer; wherein the second metal layer includes a connection portion located in the bonding area, a conductive protection layer formed by chemical plating is disposed on a surface of the connection portion, and the driving chip is connected to the conductive protection layer on the light-emitting panel.

In some embodiments, the conductive protection layer includes a tin metal layer.

In some embodiments, the light-emitting board further includes an active layer disposed on a side of the gate insulating layer away from the first metal layer, and the active layer includes an active island, wherein the active island includes a semiconductor layer, the semiconductor layer includes a channel region and a doped region located beside the channel region, an ion doped layer is disposed on the doped region, and the second metal layer further includes source and drain electrodes disposed on the ion doped layer.

In some embodiments, the light-emitting board further includes a passivation layer disposed on a side of the gate insulating layer away from the first metal layer; and the connection portion includes a first portion and a second portion located beside the first portion, the passivation layer covers the first portion, and the conductive protection layer is disposed on a surface of the second portion.

In some embodiments, the conductive protection layer covers an upper surface and a side surface of the second portion.

In some embodiments, materials of the first metal layer and the second metal layer are both copper.

Beneficial Effect

The connection portion is protected by the conductive protection layer to prevent the connection portion from being exposed and oxidized in the air, significantly increasing impedance. Moreover, since the conductive protection layer is formed on the surface of the connection portion by chemical plating, the conductive protection layer can be formed without a photomask process, for omitting one photomask process in the production of light-emitting panels. Thus, the production of light-emitting panels merely requires four photomask manufacturing processes, so as to reduce the production costs.

DESCRIPTION OF DRAWINGS

The technical solutions and other beneficial effects of the present disclosure are obvious by the following detailed description for the specific embodiments of the present disclosure with reference to the accompanying drawings.

REFERENCE NUMERALS

Figure 1:
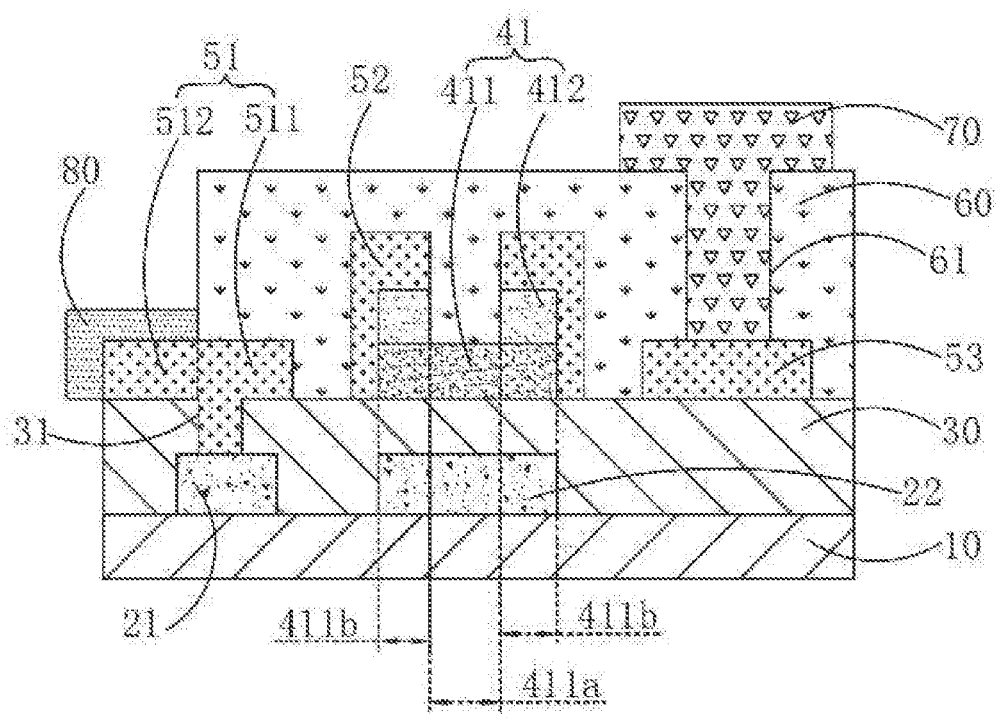
FIG. 1 is a schematic structural diagram of a light-emitting panel in an embodiment of the present disclosure.

10: substrate; 21: scanning line; 22: gate; 30: gate insulating layer; 31: connection hole; 41: active island; 411: semiconductor layer; 411a: channel region; 411b: doped region; 412: ion doped layer; 51: connection portion; 511: first portion; 512: second portion; 52: source and drain electrodes; 53: linking portion; 60: passivation layer; 61: opening; 70: light-emitting chip; 80: conductive protection layer.

DETAILED DESCRIPTION OF PREFERRED EMBODIMENTS

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc. are only directions with regard to the accompanying drawings. Therefore, the directional terms used for describing and illustrating the present disclosure are not intended to limit the present disclosure. In the drawings, units with similar structures are indicated by the same reference number.

The present application is aimed at the technical problem that the existing mini-LED and micro-LED panels, where the part of the second metal layer located in the bonding area is easily oxidized in the air. After the second metal layer is oxidized, the impedance is greatly increased, resulting in the technical problem of reduced reliability.

A light-emitting panel, as shown in FIG. 1, which includes a light-emitting board, and the light-emitting board has a light-emitting area and a bonding area located beside the light-emitting area. The light-emitting area is used to provide light source for a display screen. The bonding area is located in an edge area of the light-emitting board, and the bonding area is used to bond and connect driving chips, such as a chip on film (COF) board.

Specifically, the light-emitting panel includes a substrate 10, a first metal layer disposed on the substrate 10, a gate insulating layer 30 covering the first metal layer, a second metal layer disposed on a side of the gate insulating layer 30 away from the first metal layer, and a plurality of light-emitting chips 70 disposed on a side of the second metal layer away from the gate insulating layer 30.

It should be noted that materials of the first metal layer and the second metal layer can both be copper, so as to improve the conductivity of the first metal layer and the second metal layer while keeping the costs. Material of the gate insulating layer 30 may include one or more of silicon nitride and silicon oxide. The gate insulating layer 30 is used to isolate the first metal layer and the second metal layer, to avoid short circuits between the first metal layer and the second metal layer.

Specifically, the first metal layer includes a scanning line 21 and a gate 22, the gate 22 is located in the light-emitting area, the scanning line 21 is electrically connected to the gate 22, and the scanning line 21 transmits a scanning signal to the gate 22.

Specifically, the second metal layer includes a connection portion 51 located in the bonding area, and a conductive protection layer 80 formed by chemical plating is provided on a surface of the connection portion 51.

The connection portion 51 is used to bond and electrically connect the driving chip, such as a COF board, so as to receive the scanning signals provided by the driving chip. The connection portion 51 is electrically connected to the scanning line 21 through the connection hole 31 penetrating the gate insulating layer 30, for transmitting the scanning signals provided by the driving chip to the scanning line 21.

The connection portion 51 is protected by the conductive protection layer 80 to prevent the connection portion 51 from being exposed and oxidized in the air, significantly increasing impedance. Moreover, since the conductive protection layer 80 is formed on the surface of the connection portion 51 by chemical plating, the conductive protection layer 80 can be formed without a photomask process, for omitting one photomask process in the production of light-emitting panels to reduce the production costs.

Specifically, the conductive protection layer 80 includes a tin metal layer.

It should be noted that tin has desirable electrical conductivity, and tin is not easily oxidized or even not oxidized in air. That is, tin has desirable oxidation resistance. A tin metal layer is formed on the surface of the connection portion 51 by the chemical plating, so as to prevent the conductive protection layer 80 from forming a large impedance between the driving chip and the connection portion 51, and to prevent the connection portion 51 from being oxidized.

Specifically, the light-emitting board further includes an active layer disposed on a side of the gate insulating layer 30 away from the first metal layer. The active layer includes an active island 41, and the active island 41 is disposed to correspond to the gate 22.

Specifically, the active island 41 includes a semiconductor layer 411. The semiconductor layer 411 includes a channel region 411*a* and a doped region 411*b* located beside the channel region 411*a*. An ion doped layer 412 is disposed on the doped region 411*b*, and there is no ion doped layer 412 disposed on a position corresponding to the channel region 411*a*.

The semiconductor layer 411 may be made of amorphous silicon (a-Si), and the ion doped layer 412 may be doped with nitrogen ions.

Specifically, the second metal layer further includes source and drain electrodes 52 disposed on the ion doped layer 412, and the gate 22, the active island 41, and the source and drain electrodes 52 form a thin film transistor. The scanning signal is used to control on and off of the thin film transistor, and the thin film transistor is used to control switching on the light-emitting chip 70.

The channel is formed in the central region of the semiconductor layer 411, the doped regions 411*b* are located besides two sides of the channel region 411*a*, and the source and drain of the source and drain electrodes 52 are disposed oppositely and spaced to each other.

It should be noted that the active island 41 is formed by the semiconductor layer 411 and the ion doped layer 412 which are stacked. When the active island 41 is formed, and after the semiconductor layer 411 and the ion doped layer 412 are formed, the semiconductor layer 411, the ion doped layer 412, and the gate insulating layer 30 are patterned at the same time by a photomask in combination with a half-mask process, thereby reducing the photomask process and the production cost under the condition that the normal function of the active island 41 remains the same.

Specifically, the second metal layer further includes a linking portion 53 electrically connected to the drain of the source and drain electrodes 52. The linking portion 53 is used for the connection of the light-emitting chip 70, in order to control switching on the light-emitting chip 70 by the thin film transistor. The light-emitting chip 70 may be an LED lamp.

In an embodiment, the connection portion 51 and the linking portion 53 are both disposed on the gate insulating layer 30. Furthermore, the connection hole 31 merely penetrates the gate insulating layer 30.

In another embodiment, the connection portion 51 and the linking portion 53 may be disposed on the active layer. That is, when the active layer is patterned, the part of the active layer corresponding to the connection portion 51 and the linking portion 53 are retained. Accordingly, in the process of patterning the active layer, the processing amount for the active layer is reduced, the cost is saved, and the height difference between the linking portion 53 and the source and drain electrodes 52 is reduced, which is convenient to connect the linking portion 53 and the source and drain electrodes 52 to the light-emitting chip 70.

It should be noted that in the above embodiment, the connection hole 31 penetrates the active layer and the gate insulating layer 30.

Specifically, the light-emitting board further includes a passivation layer 60 disposed on a side of the gate insulating layer 30 away from the first metal layer, and the passivation layer 60 is disposed on the gate insulating layer 30, the active layer, and the second metal layer.

The connection portion 51 includes a first portion 511 and a second portion 512 beside the first portion 511. The passivation layer 60 covers the first portion 511, and the conductive protection layer 80 is disposed on a surface of the second portion 511.

It should be noted that the second portion 512 of the connection portion 51 is disposed close to the side of the light-emitting board, and the first portion 511 of the connection portion 51 is covered by the passivation layer 60 to strengthen the connection strength between the connection portion 51 and other film layers, thereby preventing the side of the connection portion 51 from tilting up, or preventing the connection portion 51 from falling off from the substrate 10.

In one embodiment, the conductive protection layer 80 covers an upper surface and a side surface of the second portion 512, so as to protect the exposed part of the connection portion 51 well. Moreover, an area of the conductive protection layer 80 is increased, and the impedance between the driving chip and the connection portion 51 is reduced.

Specifically, the light-emitting panel may further include an optical module located on the light-emitting side of the light-emitting board, and the optical module may include one or one of optical films such as a diffuser, a light guide plate, a reflector, and a scattering plate.

Based on the above-mentioned backplane module, the present disclosure further provides a method of manufacturing a light-emitting panel for manufacturing the above-mentioned light-emitting panel.

Figure 2:
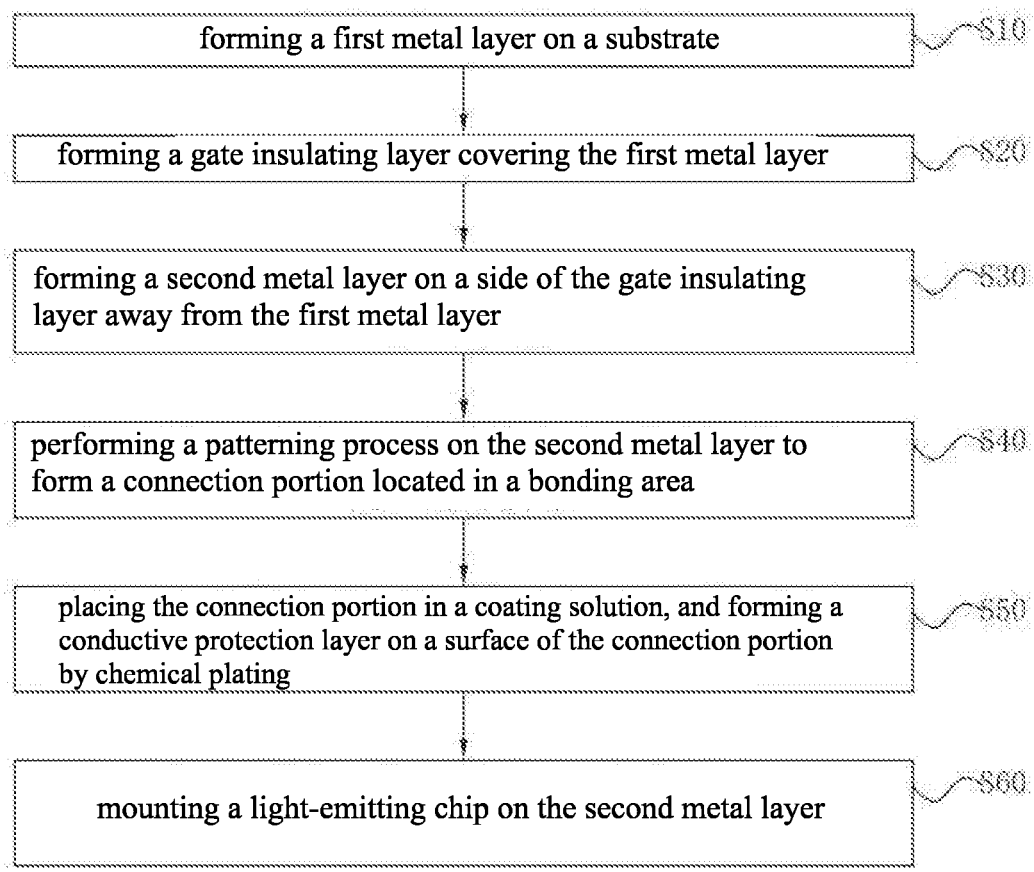
FIG. 2 is a schematic diagram of the manufacturing process of a light-emitting panel of the present disclosure.

As shown in FIG. 2, a method of manufacturing the light-emitting panel, including:

a step S10 of forming a first metal layer on a substrate 10;

a step S20 of forming a gate insulating layer 30 covering the first metal layer;

a step S30 of forming a second metal layer on a side of the gate insulating layer 30 away from the first metal layer;

a step S40 of performing a patterning process on the second metal layer to form a connection portion 51 located in a bonding area;

a step S50 of placing the connection portion 51 in a coating solution, and forming a conductive protection layer 80 on a surface of the connection portion 51 by chemical plating; and a step S60 of mounting a light-emitting chip 70 on the second metal layer.

It should be noted that the connection portion 51 is protected by the conductive protection layer 80 to prevent the connection portion 51 from being exposed and oxidized in the air, resulting in a significant increase in impedance. Moreover, since the connection portion 51 is placed in the coating solution, and then the conductive protection layer 80 is formed on the surface of the connection portion 51 by chemical plating, the conductive protection layer 80 can be formed without a photomask process, which can reduce one photomask process in the production of light-emitting panels, so as to reduce the production costs.

Specifically, after the step S20 and before the step S30, the method of manufacturing the light-emitting panel further includes:

a step S71 of forming an active layer on the gate insulating layer 30; and a step S72 of patterning the active layer to form an active island 41, while forming a connection hole 31 penetrating the gate insulating layer 30 and extending to a surface of the first metal layer;

wherein the second metal layer further includes source and drain electrodes 52 disposed on the active island 41, and the connection hole 31 is filled with the connection portion 51.

Specifically, after the step S40 and before the step S50, the method of manufacturing the light-emitting panel further includes:

a step S81 of forming a passivation layer 60 covering the second metal layer; and a step S82 of performing a patterning process on the passivation layer 60 to expose a second portion 512 of the connection portion 51.

Refer to FIGS. 3 to 8, which are schematic diagrams of manufacturing steps of the light-emitting panel in an embodiment.

Figure 3:
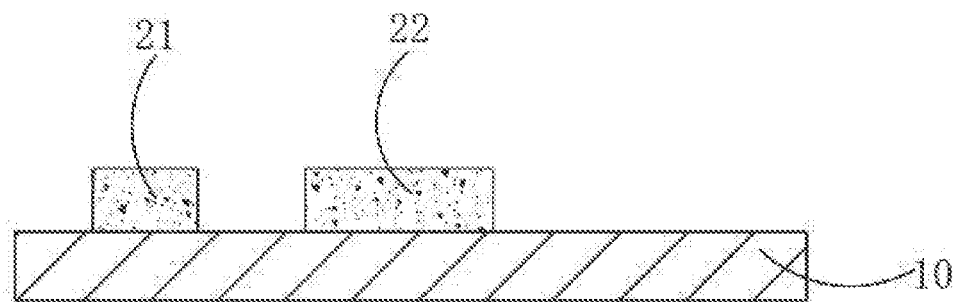
FIGS. 3-8 are schematic diagrams of steps in the manufacturing process of a light-emitting panel in an embodiment of the present disclosure.

As shown in FIG. 3, a first metal layer is formed on a substrate 10, and the first metal layer is patterned using a first photomask to form a scanning line 21 and a gate 22.

The first metal layer may be made of copper, the gate 22 is located in the light-emitting area, and the scanning line 21 is electrically connected to the gate 22.

Figure 4:
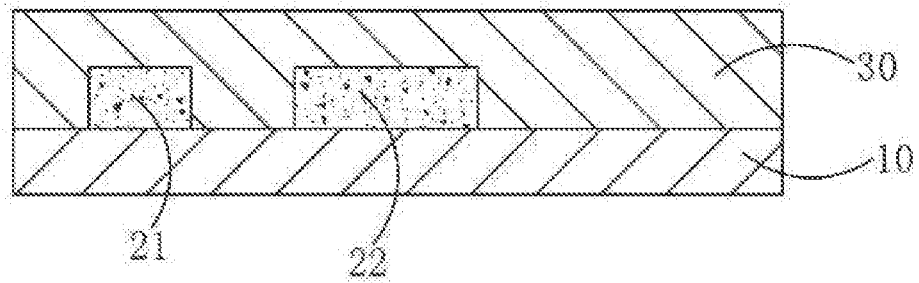

As shown in FIG. 4, a gate insulating layer 30 covering the first metal layer is formed. Material of the gate insulating layer 30 may include one or more of silicon nitride and silicon oxide.

Figure 5:
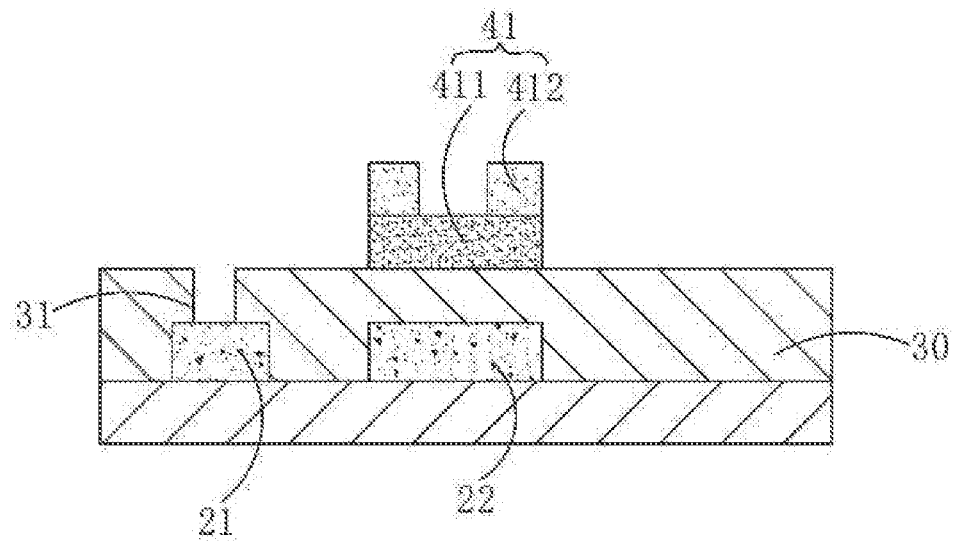

As shown in FIG. 5, a semiconductor layer 411 and an ion-doped layer 412 are sequentially stacked on the gate insulating layer 30 to form an active layer. The semiconductor layer 411 may be made of amorphous silicon (a-Si), and the ion doped layer 412 is doped with nitrogen ions.

After the ion doped layer 412 is formed, the ion doped layer 412, the semiconductor layer 411, and the gate insulating layer 30 are patterned at the same time by a second photomask in combination with a half-mask process to form the active island 41, while a connection hole 31 penetrating the gate insulating layer 30 and extending to the surface of the scanning line 21 is formed.

The position of the active island 41 corresponds to the position of the gate 22.

It should be noted that the semiconductor layer 411, the ion doped layer 412, and the gate insulating layer 30 are patterned at the same time by one photomask in combination with a half-mask process, thereby reducing the photomask process and the production cost under the condition that the normal function of the active island 41 remains the same.

Figure 6:
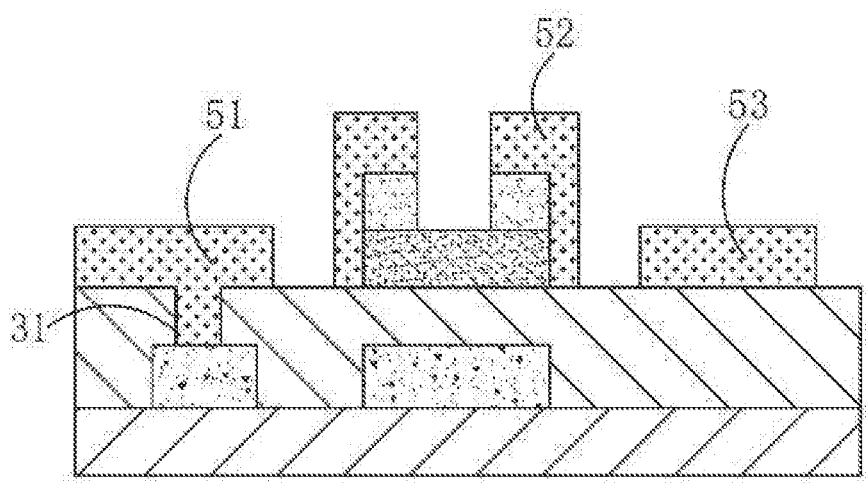

As shown in FIG. 6, a second metal layer is formed on the gate insulating layer 30 and the ion doped layer 412, and then the second metal layer is patterned using a third photomask in combination with a half-mask technique to form the connection portion 51 located in the bonding area, the source and drain electrodes 52 on the active island 41, and the linking portion 53 located on a set position. The gate 22, the active island 41, and the source and drain electrodes 52 form a thin film transistor, the scanning signal is used to control on and off of the thin film transistor, and the thin film transistor is used to control switching on the light-emitting chip 70.

Material of the second metal layer may be copper, and the connection hole 31 is filled with the connection portion 51, and the connection portion 51 is electrically connected to the scanning line 21 through the connection hole 31, so as to transmit the scanning signal provided by the driving chip to the scanning line 21. The linking portion 53 is electrically connected to the drain of the source and drain electrodes 52, and the linking portion 53 is used to connect the light-emitting chip 70, so as to control switching on the light-emitting chip 70 by the thin film transistor.

Figure 7:
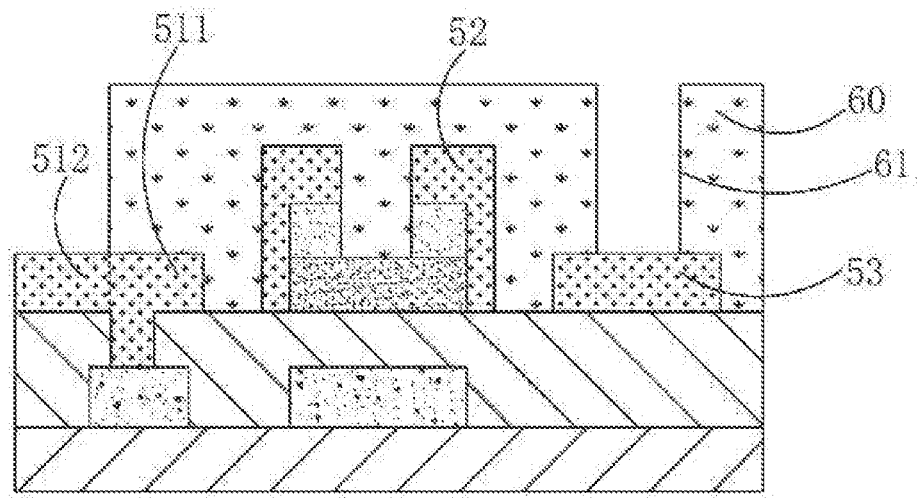

As shown in FIG. 7, a passivation layer 60 covering the second metal layer is formed, and a fourth photomask is used to pattern the passivation layer 60 to expose the second portion 512 of the connection portion 51. Moreover, an opening 61 penetrating the passivation layer 60 and extending to the linking portion 53 is formed, and the light-emitting chip 70 is electrically connected to the linking portion 53 through the opening 61.

Figure 8:
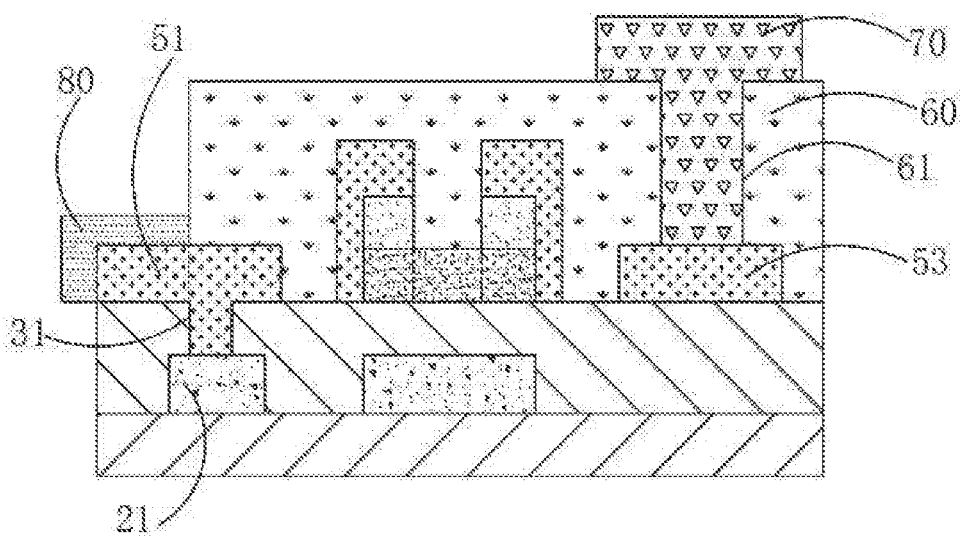

As shown in FIG. 8, the connection portion 51 is placed in a coating solution, a conductive protection layer 80 is formed on a surface of the connection portion 51 by chemical plating, and then the light-emitting chip 70 connected to the linking portion 53 is mounted.

Specifically, the conductive protection layer 80 includes a tin metal layer.

It should be noted that tin has desirable electrical conductivity, and tin is not easily oxidized or even not oxidized in air. That is, tin has desirable oxidation resistance. A tin metal layer is formed on the surface of the connection portion 51 by the chemical plating, so as to prevent the conductive protection layer 80 from forming a large impedance between the driving chip and the connection portion 51, and to prevent the connection portion 51 from being oxidized.

Specifically, the coating solution includes positive divalent tin ions and thiol-based urea.

It should be noted that when the connection portion 51 is placed in a coating solution containing positive divalent tin ions and thiol-based urea, the thiol-based urea is a strong complexing agent, which is capable of transferring potential on a copper surface to a low direction, so that tin can be precipitated on the copper surface, thereby forming a tin metal layer on the surface of the connection portion 51 by the reductive chemical tin plating method. The chemical equation is: $Cu+Sn^{2+}+N \rightarrow Sn+CuN$, where Cu represents copper, $Sn^{2+}$ represents positive divalent tin ion, and N represents thiol group.

Based on the above-mentioned light-emitting panel, the present disclosure further provides a display panel that includes a driving chip and the light-emitting panel as described in any of the above embodiments, and the driving chip is connected to the conductive protection layer of the light-emitting panel.

It should be noted that the display panel may further include a display screen body, and the light-emitting panel is disposed on a back side of the display screen body. That is, the light-emitting panel is a backlight module of the display panel, the display panel includes an array substrate and a color filter substrate oppositely arranged, and the liquid crystal layer is filled between the array substrate and the color filter substrate.

The light-emitting panel can also be used as a display panel. That is, the display panel does not include structures such as an array substrate and a liquid crystal layer.

In the aforementioned embodiments, the description of each embodiment has its own emphasis. For a part that is not detailed in an embodiment, refer to related descriptions in other embodiments.

Specific embodiments are used herein to explain the principles and implementation of the present disclosure. The above embodiments are used to assist in understanding the technical solutions and the core ideas of this disclosure. Those of ordinary skill in the art should understand that the technical solutions described in the foregoing embodiments can be modified, or some of the technical features can be replaced. These modifications and replacements do not substantially deviate the corresponding technical solutions from the scopes of the technical solutions of the embodiments of the present disclosure.

What is claimed is:

1. A light-emitting panel, comprising: a light-emitting board, the light-emitting board including a light-emitting area and a bonding area located beside the light-emitting area, wherein the light-emitting board includes:
    a substrate;
    a first metal layer disposed on the substrate and comprising a gate and a scanning line electrically connected to the gate;
    a gate insulating layer covering the first metal layer and comprising a connection hole defined through the gate insulating layer;
    a second metal layer disposed on a side of the gate insulating layer away from the first metal layer; and
    a light-emitting chip disposed on a side of the second metal layer away from the gate insulating layer;
    wherein the second metal layer includes a chip-scanning-line connection portion located in the bonding area and electrically connected to the scanning line through the connection hole, and a conductive protection layer formed by chemical plating is disposed on a surface of the chip-scanning-line connection portion.

2. The light-emitting panel of claim 1, wherein the conductive protection layer includes a tin metal layer.

3. The light-emitting panel of claim 1, wherein the light-emitting board further includes an active layer disposed on a side of the gate insulating layer away from the first metal layer, and the active layer includes an active island,
    wherein the active island includes a semiconductor layer, the semiconductor layer includes a channel region and a doped region located beside the channel region, an ion doped layer is disposed on the doped region, and the second metal layer further includes source and drain electrodes disposed on the ion doped layer.

4. The light-emitting panel of claim 1, wherein the light-emitting board further includes a passivation layer disposed on a side of the gate insulating layer away from the first metal layer; and
    the chip-scanning-line connection portion includes a first portion and a second portion located on a side of the first portion, the passivation layer covers the first portion, and the conductive protection layer is disposed on a surface of the second portion.

5. The light-emitting panel of claim 4, wherein the conductive protection layer covers an upper surface and a side surface of the second portion.

6. The light-emitting panel of claim 1, wherein materials of the first metal layer and the second metal layer are both copper.

7. A display panel, comprising: a driving chip and a light-emitting panel, the light-emitting panel including a light-emitting board, the light-emitting board including a light-emitting area and a bonding area located beside the light-emitting area, and the light-emitting board including:
    a substrate;
    a first metal layer disposed on the substrate and comprising a gate and a scanning line electrically connected to the gate;
    a gate insulating layer covering the first metal layer and comprising a connection hole defined through the gate insulating layer;
    a second metal layer disposed on a side of the gate insulating layer away from the first metal layer; and
    a light-emitting chip disposed on a side of the second metal layer away from the gate insulating layer;
    wherein the second metal layer includes a chip-scanning-line connection portion located in the bonding area and electrically connected to the scanning line through the connection hole, a conductive protection layer formed by chemical plating is disposed on a surface of the chip-scanning-line connection portion, and the driving chip is connected to the conductive protection layer on the light-emitting panel.

8. The display panel of claim 7, wherein the conductive protection layer includes a tin metal layer.

9. The display panel of claim 7, wherein the light-emitting board further includes an active layer disposed on a side of the gate insulating layer away from the first metal layer, and the active layer includes an active island,
    wherein the active island includes a semiconductor layer, the semiconductor layer includes a channel region and a doped region located beside the channel region, an ion doped layer is disposed on the doped region, and the second metal layer further includes source and drain electrodes disposed on the ion doped layer.

10. The display panel of claim 7, wherein the light-emitting board further includes a passivation layer disposed on a side of the gate insulating layer away from the first metal layer; and
    the chip-scanning-line connection portion includes a first portion and a second portion located beside the first portion, the passivation layer covers the first portion, and the conductive protection layer is disposed on a surface of the second portion.

11. The display panel of claim 10, wherein the conductive protection layer covers an upper surface and a side surface of the second portion.

12. The display panel of claim 7, wherein materials of the first metal layer and the second metal layer are both copper.

* * * * *